United States Patent [19]

Miniet

[11] Patent Number: 4,489,999

[45] Date of Patent: Dec. 25, 1984

[54] SOCKET AND FLEXIBLE PC BOARD ASSEMBLY AND METHOD FOR MAKING

[75] Inventor: Jay J. Miniet, Fort Lauderdale, Fla.

[73] Assignee: Motorola, Inc., Schaumburg, Ill.

[21] Appl. No.: 466,467

[22] Filed: Feb. 15, 1983

[51] Int. Cl.³ .............................................. H01R 9/09
[52] U.S. Cl. .................... 339/17 CF; 29/845; 339/19 F; 339/176 MF
[58] Field of Search .................... 29/842, 844, 845; 339/17 F, 176 MF, 17 CF, 17 C, 17 M

[56] References Cited

U.S. PATENT DOCUMENTS

| | | | |
|---|---|---|---|
| 3,627,902 | 12/1971 | Meyers et al. | 174/68.5 |
| 3,740,678 | 6/1973 | Hill | 333/84 M |
| 3,766,439 | 10/1973 | Isaacson | 317/100 |
| 3,783,433 | 1/1974 | Kurtz et al. | 339/17 C |
| 3,792,412 | 2/1974 | Madden | 339/17 C |
| 3,850,491 | 11/1974 | Mouissie | 339/17 C |
| 3,865,455 | 2/1975 | Berg | 339/17 C |
| 3,871,728 | 3/1975 | Goodman | 339/14 R |
| 3,873,889 | 3/1975 | Leyba | 317/101 R |
| 3,923,359 | 12/1975 | Newsam | 339/17 M |
| 3,927,925 | 12/1975 | Borsuk | 339/14 P |
| 3,971,127 | 7/1976 | Giguere et al. | 29/626 |
| 3,977,075 | 8/1975 | Lynch et al. | 29/628 |
| 4,015,328 | 4/1977 | McDonough | 29/625 |
| 4,104,701 | 8/1978 | Baranowski | 361/386 |
| 4,113,981 | 9/1978 | Fujita et al. | 339/17 F |
| 4,116,516 | 9/1978 | Griffin | 339/17 F |
| 4,175,810 | 11/1979 | Holt et al. | 339/17 C |
| 4,398,779 | 8/1983 | Ling | 339/186 M |

*Primary Examiner*—John McQuade
*Attorney, Agent, or Firm*—Charles L. Warren; Edward M. Roney; James W. Gillman

[57] ABSTRACT

The integral interconnect socket and flexible board assembly accepts an electronic module having a plurality of leads arranged in a predetermined pattern. The assembly includes a flexible printed circuit (PC) board having a plurality of conductors and a first set of holes disposed to respectively intersect the conductors. A substantially rigid platform is mounted to the PC board and has a second set of holes. The first and second set of holes are in alignment and define common apertures arranged in the predetermined pattern to receive the leads of the modules. A layer of metal plating formed within the apertures makes electrical connections with the respective conductors. Jacks are mounted to each aperture for receiving the leads and making electrical connections between the leads and the conductors.

8 Claims, 2 Drawing Figures

SOCKET AND FLEXIBLE PC BOARD ASSEMBLY AND METHOD FOR MAKING

BACKGROUND OF THE INVENTION

The present invention relates generally to sockets which receive an electronic module and provide electrical connections between pins projecting from the module and external circuits. It relates more specifically to a socket capable of making solderless connections between an electronic module and a flexible circuit board.

There are many instances where, due to the miniaturization and portability of an electronic device, the relative density of the electrical components places a premium on the available space. Several packaging arrangements for miniaturized electronic circuit modules utilizing combination sockets and headers are known in the art and have various disadvantages when compared with the present invention. Generally, the prior art sockets contain electrical contacts which are made of sheet metal and require soldering to ensure electrical connection between the contacts and the circuits on the socket mounting PC board.

So-called flexible printed circuits (PC) of one sort or another has been incorporated in a wide variety of electrical and electronic devices. It is particularly advantageous for use with miniaturized electronic apparatus where space is critical and bulky wire-to-wire connections are to be minimized or eliminated. For example, portable, two-way communication equipment provides an advantageous application for flexible printed circuitry.

SUMMARY OF THE INVENTION

It is an object of this invention to provide an integrated solderless interconnect socket and flexible electronic circuit board for holding miniaturized electronic modules.

Another object of the present invention is to provide such a socket and board assembly which is rugged and which can withstand considerable mishandling or abuse.

It is yet another object of the present invention to provide a method for making an integrated solderless interconnect socket and flexible PC board assembly.

In practicing the invention, an integrated solderless interconnect socket and flexible PC board assembly is provided for establishing electrical connections with a miniaturized electronic module which is received by the socket. An interconnect platform has two major surfaces of sufficient size and shape to accept an electronic module having a plurality of electrical connection pins or leads. The interconnect platform is affixed to a flexible circuit board via a bonding agent. A plurality of aligned apertures in the platform and circuit board are located to accept the pins of the module. The apertures are plated with a conductive material to establish electrical connections with the conductor on the flexible circuit board. Conductive jacks are mounted within the plated-through apertures and are configured to engage the pins of the electronic module. Additionally, the interconnect platform may have at least one countersunk aperture to receive a keyed locating post on the module to prevent the misaligned insertion of the module.

BRIEF DESCRIPTION OF THE DRAWINGS

The features of the present invention which are believed to be novel are set forth with particularity in the claims. However, the invention itself, together with further objects and advantages thereof, may be best understood by reference to the following description when taken in conjunction with the accompanying drawings, in which like reference numerals refer to like elements in the several figures, and in which:

DETAILED DESCRIPTION OF THE PREFERRED EMBODIMENT

Figure 1:
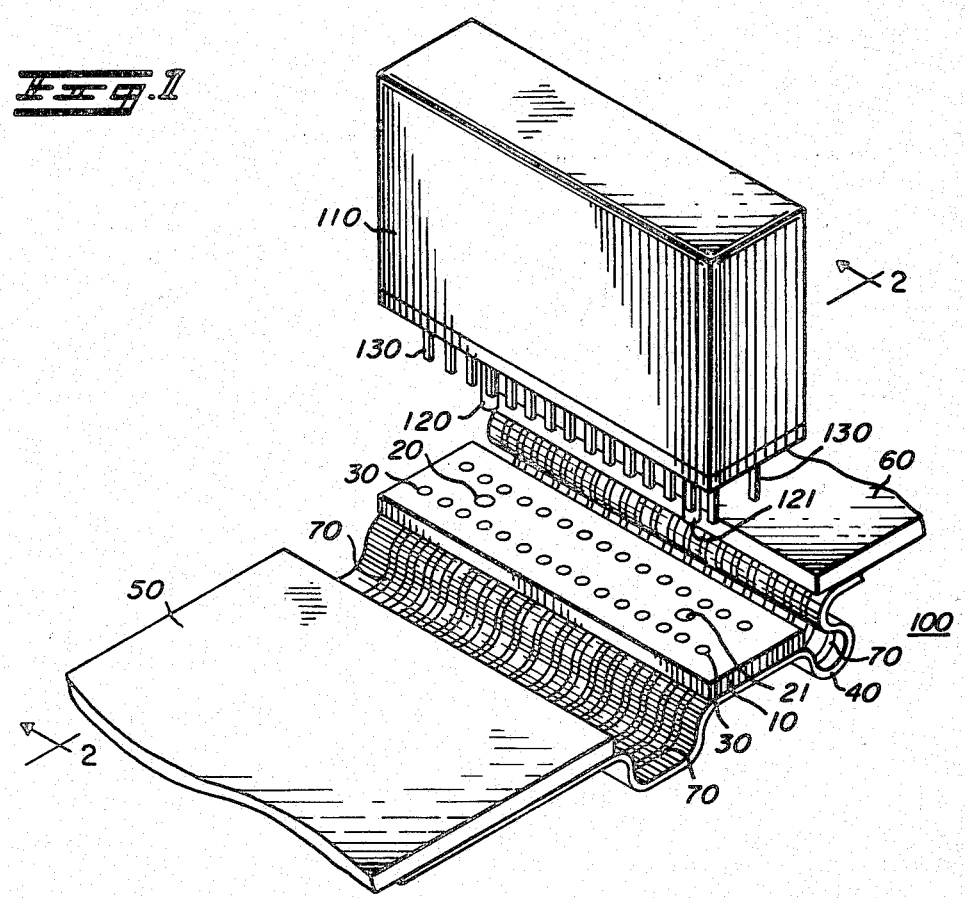
FIG. 1 is a perspective view of an embodiment of this invention with a miniaturized electronic circuit module positioned for insertion therein.

Referring now to FIG. 1, an integrated interconnect socket and flexible PC board assembly 100 includes a miniaturized electronic circuit module 110 which has locating pins or keys 120 and 121 protruding from its bottom surface and a plurality of component leads 130 for providing connections with the electronic circuitry which is housed internally within the miniaturized electronic module 110. The component leads 130 are shorter than the locating pins 120 and 121 which are positioned to prevent the reverse or misaligned insertion of the miniaturized electronic module 110 into assembly 100.

The interconnect socket and flexible PC board assembly 100 has a rigid electrically insulative platform 10 of a size sufficient to accept the leads 130 of the miniaturized electronic circuit module 110. Countersunk holes 20 and 21 are located in a predetermined keyed pattern within the platform 10 to receive the pins 120 and 121.

A plurality of holes 30 in platform 10 are arranged in the same pattern as the leads 130 to permit insertion of the corresponding component leads 130 into holes 30. The platform 10 is bonded to the flexible PC board 40 by the utilization of a suitable bonding agent such as an acrylic adhesive. The platform 10 has a sufficient thickness to provide stability at the moment of insertion of the associated electronic circuit module 110 into the respective holes 30.

The flexible PC board 40 provides electrical connections between the leads 130 and other circuitry such as a main printed circuit board 50 and another printed circuit board 60. The flexible PC board 40 has a number of conductors 70 that intersect holes 42 in the board which are aligned with holes 30. The holes 30 and 42 are plated with a conductive metalization 95 to form plated-through holes which are connected respectively to conductors 70.

Figure 2:
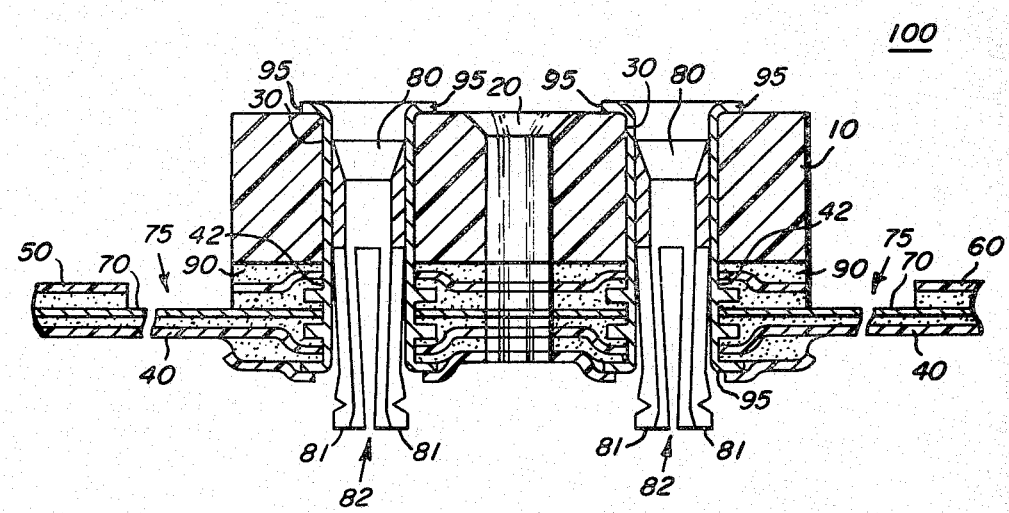
FIG. 2 is an enlarged cross-sectional view of the embodiment of the invention taken along line 2—2 of FIG. 1.

Referring to FIG. 2, platform 10 is bonded to the flexible PC board 40 through the use of a suitable bonding agent 90 such as an acrylic adhesive. An epoxy fiberglass material is suitable for platform 10 and flexible PC board 40 can be made of a polymide material. The countersunk hole 20 receives the corresponding locating pin 120 (see FIG. 1). Holes 30 and 42 extend through the platform 10 and the PC board 40, respectively. These holes are plated-through with appropriate metallization 95 to make electrical connection with conductors 70 on PC board 40.

Into each respective hole 30 and 42 is pressed a metal socket or jack 80 of a sufficient size to accept the component leads 130 of the electronic circuit module 110. The socket members 80 have open-ended springy fingers 81 which project inwardly to define a narrowed channel 82 having a smaller dimension than the component leads. The fingers expand upon insertion of the leads to make a good electrical connection between same. The jacks engage the metalization 95 in the holes and establish a reliable electrical connection therewith.

The flexible PC board 40 is preferably reduced in thickness at points 75 adjacent to the platform 10 to provide increased pliability and bendability at these locations. The conductors 70 on the flexible PC board 40 connects the main printed circuit board 50, the other PC board 60, and the plug-in electronic module 110.

In making the socket and flexible board assembly of this invention, a pattern of holes 42 are drilled in PC board 40 so as to intersect the conductors 70. Holes 30 are drilled in platform 10 to align with holes 42. The platform is bonded to board 40 and the aligned holes are plated with a metalization 95 to form plated-through holes which establish electrical connections with the respective conductors 70. Of course, the holes could be simultaneously drilled after the socket is mounted to the flexible PC board. The jacks 80 are press fit into the plated-through holes; the resilient fingers 81 on the jacks expand in response to insertion of the leads 130 of module 110 to establish electrical connection therewith. Thus this invention permits an electrical module to be solderlessly received and supported by a flexible PC board.

Although the foregoing has been a description and illustration of a specific embodiment of the invention, various modifications and changes thereto can be made by persons skilled in the art within the scope and spirit of the invention as defined by the following claims.

What is claimed is:

1. An integral interconnect socket and flexible board assembly for accepting an electronic module having a plurality of leads arranged in a predetermined pattern, said assembly comprising:
    a flexible printed circuit (PC) board having a plurality of conductors and a first set of holes disposed to respectively intersect said conductors;
    a substantially rigid platform mounted to and solely supported by said PC board and having a second set of holes, said first and second set of holes being in alignment to define common apertures arranged in said predetermined pattern to receive said leads;
    means for forming electrically conductive areas within said apertures and making electrical connections with the respective conductors;
    a jack means mounted to each aperture for receiving said leads and making electrical connections between said conductive areas and said leads; and
    means for keying said platform to inhibit the misaligned insertion of said leads of the module into said apertures.

2. The assembly according to claim 1 wherein said forming means comprises a layer of metallic plating disposed within said apertures.

3. The assembly according to claim 1 wherein said jack means comprise metal jacks having springy fingers disposed to engage said leads upon the insertion of the latter into said jacks.

4. The assembly according to claim 1 wherein said flexible PC board has reduced thickness areas adjacent the periphery of said platform to increase the flexibility of said PC board in said areas thereby allowing the PC board to be formed in a direction away from the platform at said areas.

5. A method for making an integral interconnect socket and flexible board assembly that accepts an electronic module having a plurality of leads arranged in a predetermined pattern, said method comprising the steps of:
    bonding a flexible PC board having a plurality of conductors to a platform so that the PC board solely supports the platform;
    depositing a conductive plating within apertures which extend through said platform and PC board in said predetermined pattern, said plating in each aperture making connection with said respective conductors; and
    mounting jacks in engagement with each of said plated apertures, said jacks configured to receivingly engage said leads.

6. The method according to claim 5 further comprising the step of placing a layer of adhesive between said PC board and platform.

7. The method according to claim 5 further comprising the step of press fitting said jacks within said apertures.

8. The method according to claim 5 further comprising the step of bonding the platform to the flexible PC board such that the platform is surrounded by areas of the PC board having reduced thickness.

* * * * *